United States Patent [19]
Link

[11] Patent Number: 5,802,089
[45] Date of Patent: Sep. 1, 1998

[54] LASER DIODE DRIVER HAVING AUTOMATIC POWER CONTROL WITH SMOOTH ENABLE FUNCTION

[75] Inventor: Garry N. Link, Aloha, Oreg.

[73] Assignee: Maxim Integrated Products, Inc., Sunnyvale, Calif.

[21] Appl. No.: 731,889

[22] Filed: Oct. 22, 1996

[51] Int. Cl.[6] .................... H01S 3/00; H01S 3/10; H01S 3/13
[52] U.S. Cl. .................... 372/38; 372/26; 372/29
[58] Field of Search .................... 372/38, 29, 26, 372/33; 102/201

[56] References Cited

U.S. PATENT DOCUMENTS

| H322 | 8/1987 | Simons | 372/38 |
|---|---|---|---|
| 4,789,987 | 12/1988 | Fraser | 372/31 |
| 4,837,428 | 6/1989 | Takagi et al. | 372/29 |
| 4,837,787 | 6/1989 | Takesue et al. | 372/29 |
| 4,856,011 | 8/1989 | Shimada et al. | 372/38 |
| 5,373,387 | 12/1994 | Bosch et al. | 372/31 |
| 5,402,533 | 3/1995 | Stiscia | 372/31 |
| 5,408,485 | 4/1995 | Ries | 372/32 |
| 5,444,728 | 8/1995 | Thompson | 372/38 |
| 5,473,623 | 12/1995 | Fahey et al. | 372/38 |
| 5,479,424 | 12/1995 | Sakuyama | 372/38 |

FOREIGN PATENT DOCUMENTS

| 60-169182 | 9/1985 | Japan | 372/38 |
|---|---|---|---|
| 3-255684 | 11/1991 | Japan | 372/38 |

OTHER PUBLICATIONS

Technical Manual, "Single+5V, Fully Integrated, 1.2Ggps Laser Diode Driver," (MAX3261) Maxim Integrated Products, Inc., 1995, (No Month Available).

*Primary Examiner*—Rodney B. Bovernick
*Assistant Examiner*—Quyen Phan Leung
*Attorney, Agent, or Firm*—Hickman & Martine, LLP

[57] ABSTRACT

A laser diode driver with automatic power control in which start-up characteristics are controlled to avoid unsafe power levels at a driven laser is disclosed. The laser diode driver according to the invention produces a bias control signal that controls a bias current source such that the bias current supplied to the laser is maintained below a predetermined level during a start-up period.

21 Claims, 8 Drawing Sheets

LASER DIODE DRIVER HAVING AUTOMATIC POWER CONTROL WITH SMOOTH ENABLE FUNCTION

BACKGROUND OF THE INVENTION

1. Field of the Invention

The present invention relates to laser diode drivers, and more particularly, to laser diode drivers having automatic power control.

2. Description of the Related Art

FIG. 1 is a schematic diagram of a conventional laser diode driver 100. The laser diode driver 100 provides automatic power control to provide constant optical power despite changes in the laser characteristics due to temperature variation or aging. The automatic power control is implemented through a feed back loop that senses average optical power from the laser and adjusts a laser bias current so as to maintain constant optical power. The conventional laser diode driver 100 illustrated in FIG. 1 is representative of the laser diode driver MAX3261 produced by Maxim Integrated Products, Inc. of Sunnyvale, Calif.

The laser diode driver 100 drives a laser 102 using a bias current provided by a bias current source (BIAS) 104. In addition to biasing the laser 102, the laser diode driver 100 also controls the laser 102 to transmit signals (such as digital data) for data communications applications. In this regard, the laser diode driver 100 includes a differential pair of transistors 106 and 108 together with a modulation current source (IMOD) 110 to modulate the digital data for transmission by the laser 102. The bias current source (IBIAS) 104 is controlled by a bias control signal 112. The bias control signal 112 modifies the bias current for the laser 102 so as to provide the automatic power control function.

A photodiode 114 is optically coupled to the laser 102 to receive an indication of the optical power of the laser 102. In proportion to optical power thus detected, the photodiode 114 produces a current. The photodiode 114 is connected between a source potential (VCC) and a detector current source (IDET) 116. One terminal of the photodiode 114 and one terminal of the detection current source (IDET) 116 are connected to an inverting input of an amplifier 118 at a node 120. Hence, the detector current source (IDET) 116 is connected between the node 120 and a ground potential (GND). In addition, a capacitor 122 is coupled between the source potential (VCC) and the node 120. The non-inverting input to the amplifier 118 receives a reference voltage (REF). The laser diode driver 100 further receives an enable signal (ENABLE) that serves to enable the bias current source (IBIAS) 104 and the modulation current source (IMOD) 110.

It is desirable to have the laser diode driver 100 turn on the laser 102 in a smooth manner so that optical power does not exceed safe levels. The laser 102 is turned on when either the power supply is brought up or an enable signal is asserted. The laser diode driver 100 illustrated in FIG. 1 works effectively when the power supply is brought up or turned on because the capacitor 122 causes the output of the amplifier 118 to initialize in a low state. Hence, the bias current source (IBIAS) 104 will initially remain off during the turn on of the power supply. After the power supply is turned on, the detection current (IDET) 116 slews the capacitor 122 until the voltage at the inverting input of the amplifier 118 gradually rises to the reference voltage (REF) at which point the automated power control loop closes. Consequently, the laser 102 will not turn on until a constant delay (controlled by the capacitor 122) after the turn on of the power supply.

One problem, however, is that the laser diode driver 100 does not output safe power levels when the enable signal (ENABLE) is asserted. In the disabled state, the voltage appearing at the inverted input of the amplifier 118 is pulled low by the detection current source (IDET) 116 and by the input bias current of the amplifier 118. In this situation, the laser 102 is off and the current through the photodiode 114 is negligible. In the disabled state, the current sources (IBIAS) 104 and (IMOD) 110 are both off. Once the enable signal (ENABLE) goes "high" to enable the laser diode driver 100, the bias control signal 112 output from the amplifier 118 will be high because the inverting input is below the reference voltage (REF). When the bias control signal 112 output from the amplifier 118 is high, the bias current source (IBIAS) 104 will go to the maximum value as determined by external resistors. This maximum bias current induced by the bias current source (IBIAS) 104 can be several times larger than the desired operating current, depending on the configuration of the external resistors. This causes the optical power of the laser 102 to increase to a large, potentially unsafe value. The resulting large optical power can not only damage the laser being driven but can also damage human eyesight. The increased optical power results in a large current through the photodiode 114 which slews the capacitor 122 at the node 120 towards the reference voltage (REF). Once the node 120, as well as the inverting input of the amplifier 118, reaches the reference voltage (REF), the feedback loop closes and the optical power of the laser 102 reduces to the desired level as set by the bias control signal 112 in accordance with a stabilized voltage level at the inverting input of the amplifier 118 set by the detection current source (IDET) 116.

Thus, there is a need to ensure smooth start-up of the laser diode driver following the assertion of the enable signal.

SUMMARY OF THE INVENTION

Broadly speaking, the invention pertains to a laser diode driver with automatic power control in which start-up characteristics are controlled to avoid unsafe optical power levels from a driven laser. The laser diode driver according to the invention produces a bias control signal that controls a bias current source such that the bias current supplied to the laser is maintained below a predetermined level during a start-up period.

The invention can be implemented in numerous ways, including as an apparatus or a method. Several embodiments of the invention are discussed below.

As a laser diode driver for driving a laser, an embodiment of the invention includes: a light sensing device coupled between a voltage supply and a node, the light sensing device senses optical power of the laser; a current source coupled to the light receiving device at the node; an amplifier having an inverting input and a non-inverting input and producing a bias control signal, the inverting input being coupled to the node and the non-inverting input being coupled to receive a reference voltage, and the bias control signal being used to control the driving of the laser; a capacitor coupled between the voltage supply and the node; and holding means for holding the bias control signal below a predetermined level during a start-up period. Preferably, the bias control signal is used to control an average optical power of the laser.

As a laser diode driver for driving a laser, the laser diode driver receiving an enable signal and being coupled to a voltage supply, another embodiment of the invention includes: a light sensing device coupled between the voltage supply and a node, the light sensing device senses optical power of the laser; a current source coupled to the light receiving device at the node; an amplifier having an inverting input and a non-inverting input and producing a bias control signal, the inverting input being coupled to the node and the non-inverting input being coupled to receive a reference voltage, and the bias control signal being used to control the driving of the laser; a capacitor coupled between the voltage supply and the node; and a switching device coupled between the voltage supply and the node, the switching device being operated by an inverted enable signal for the laser diode driver.

As a laser diode driver for driving a laser, yet another embodiment of the invention includes: a light sensing device coupled between a voltage supply and a node, the light sensing device senses optical power of the laser; a current source coupled to the light receiving device at the node; an amplifier having an inverting input and a non-inverting input and producing a bias control signal, the inverting input being coupled to the node and the non-inverting input being coupled to receive a reference voltage, and the bias control signal being used to control the driving of the laser; a capacitor coupled between the voltage supply and the node; and means for smoothly enabling the laser diode driver when the laser diode driver is enabled.

As a method for biasing a laser, an embodiment of the invention includes the operations of: providing a light sensing device optically coupled to the laser to sense optical power of the laser; producing a measured voltage indicative of the optical power of the laser using the light sensing device; comparing the measured voltage against a reference voltage to produce a bias control signal; modifying a bias drive current for the laser in accordance with the bias control signal; and holding the bias drive current below a first predetermined level during a start-up period.

The advantages of the invention are numerous. One advantage of the invention is that a laser can be safely driven following activation by an enable signal. As a result, the optical power of the laser is safely controlled following an enable signal in accordance with laser safety rules (e.g., for lasers used in home and office). Another advantage of the invention is that the stress to the laser is minimized because the undesirably large optical power levels conventionally provided are prevented by the invention. Still another advantage of the invention is that it is suitable for fabrication as an integrated circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to a laser diode driver with automatic power control in which start-up characteristics are controlled to avoid unsafe power levels at a driven laser. In general, the laser diode driver produces a bias control signal that controls a bias current source such that the bias current supplied to the laser is maintained below a predetermined level during a start-up period.

Embodiments of the invention are discussed below with reference to FIGS. 2–8. However, those skilled in the art will readily appreciate that the detailed description given herein with respect to these figures is for explanatory purposes as the invention extends beyond these limited embodiments.

Figure 1:
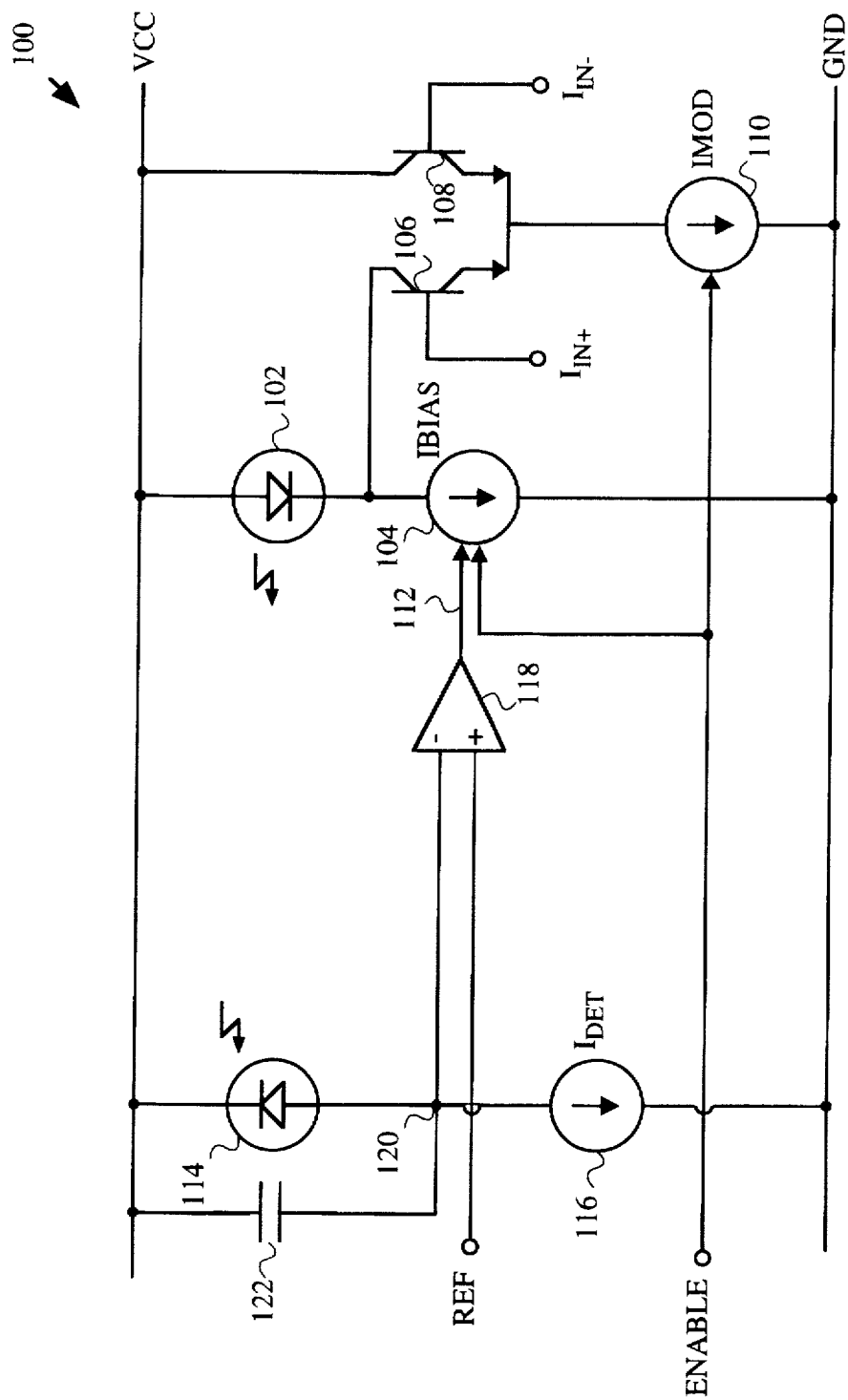
FIG. 1 is a schematic diagram of a conventional laser diode driver.
Figure 2:
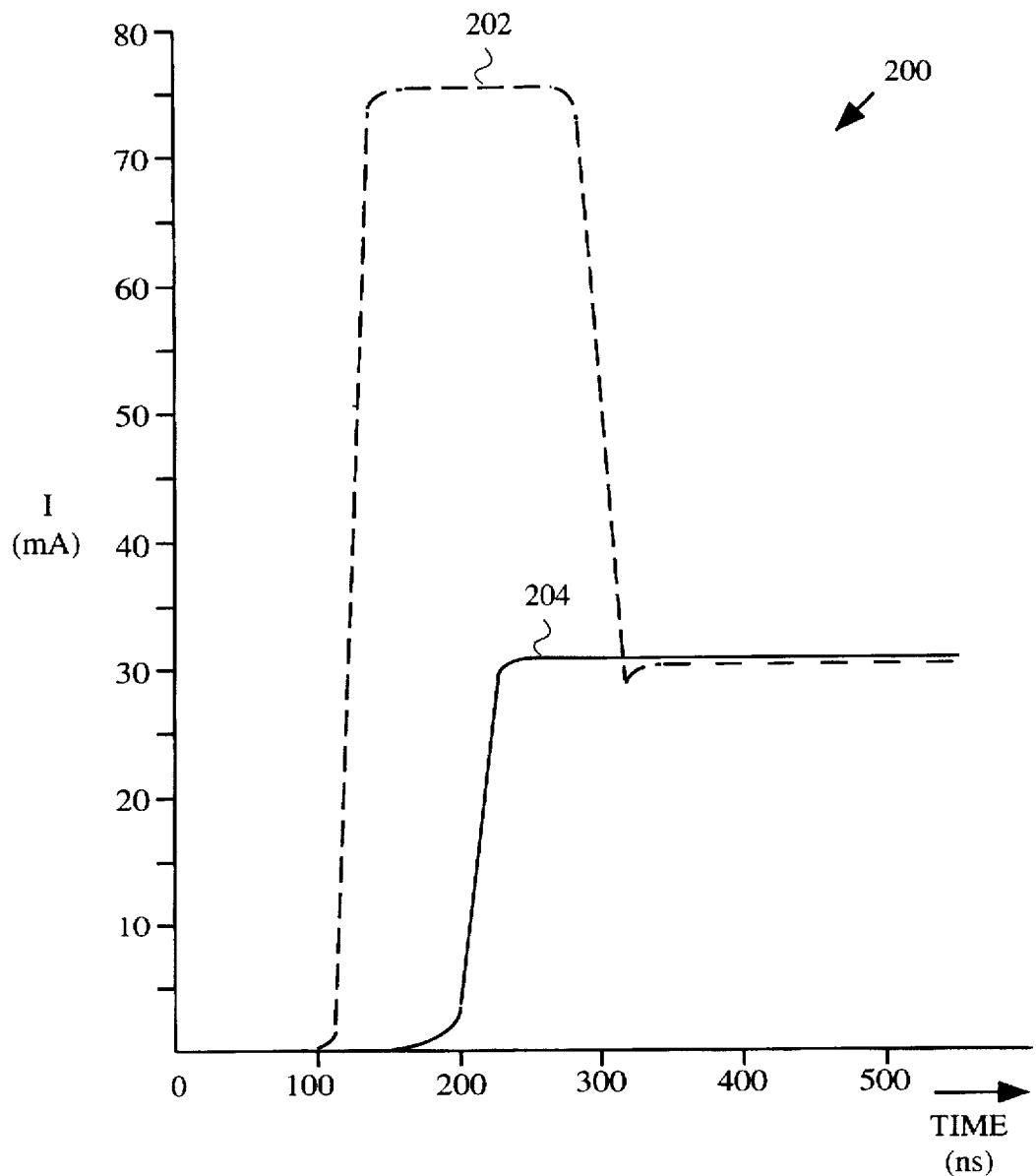
FIG. 2 is an exemplary graphical plot of laser bias current as a function of time following an enable signal for both a representative conventional laser diode driver and a representative laser diode driver according to the invention.

FIG. 2 is an exemplary graphical plot 200 of laser bias current as a function of time following turn-on for both the conventional laser diode driver 100 and a representative laser diode driver according to the invention. The turn-on of a laser diode driver is due to an enable signal (ENABLE) being asserted. The plot 200 illustrates a first current curve 202 that represents the laser bias current for the conventional laser diode driver 100 and a second curve 204 that represents the laser bias current for a laser diode driver in accordance with the invention. Notice that the first current curve 202 rises abruptly to a level of 75 milliamperes (mA) before stabilizing about 300 nanoseconds (ns) after the assertion of the enable signal. The first current curve 202 is unsatisfactory because it increases to a large, unsafe current from 100 ns and 300 ns in this example. In this exemplary case, anything above about 40 mA is unsafe. As noted above, the unsafe current can destroy lasers and cause blindness by damaging human eyesight. In contrast, the second current curve 204 rises more smoothly to a stable current value about 200 ns after the assertion of the enable signal without having any unsafe values.

Figure 3:
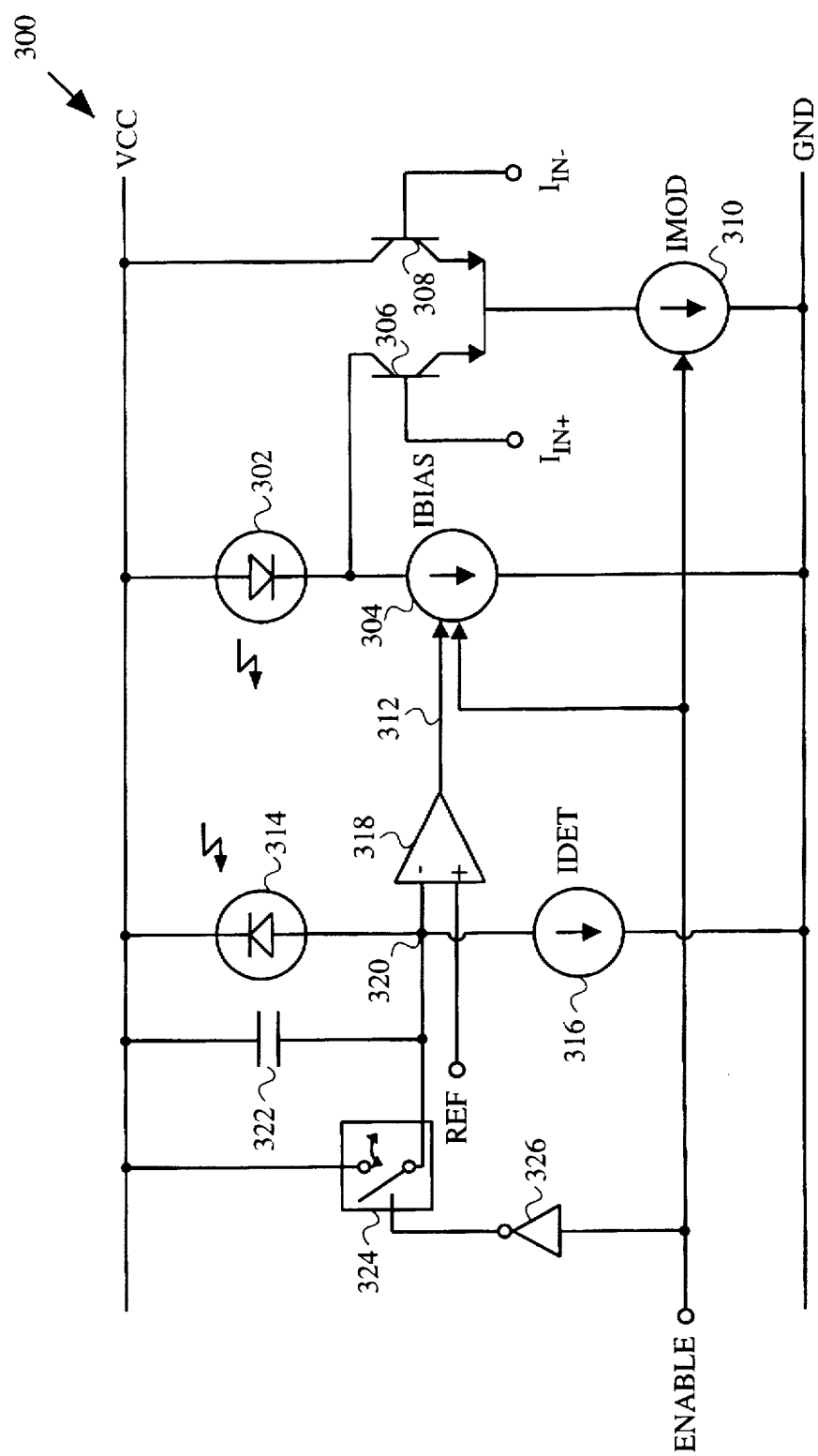
FIG. 3 is schematic diagram of a laser diode driver according to a first embodiment of the invention.

FIG. 3 is schematic diagram of a laser diode driver 300 according to a first embodiment of the invention. The laser diode driver 300 drives a laser 302 to provide data transmission over a communications medium. As an example, the light produced by the laser 302 can be transmitted over a fiber optic cable to a receiving device (not shown). The laser 302 is biased by a bias current source (IBIAS) 304. Data signals are further modulated onto the light output by the laser 302 by selectively switching additional current provided by a modulation current source (IMOD) 310 to the laser 302. The switching operations are controlled by a differential pair of transistors 306 and 308. It should be noted that switching operations would not be needed in non-communications applications.

The bias current source (IBIAS) 304 is provided with an automatic power control function in accordance with a bias control signal 312. The automatic power control is implemented through a feed back loop that senses average optical power from the laser and adjusts a laser bias current so as to maintain constant optical power. The bias control signal 312 is produced using a photodiode 314, a detection current source (IDET) 316, an amplifier 318, a node 320, a capacitor 322, and a switch 324. The photodiode 314 is optically coupled to the laser 302 and produces a current in proportion to the output power of the laser 302. The photodiode 314 as well as the capacitor 322 are connected between a first supply voltage (VCC) and the node 320. The node 320 is also connected to the inverting input of the amplifier 318. The non-inverting input of the amplifier 318 receives a reference voltage (REF). The detection current source (IDET) 316 is connected between the node 320 and a second supply voltage (GND). In one implementation, the first voltage supply (VCC) is 5 Volts, the second supply voltage (GND) is 0 Volts, and the reference voltage (REF) is about 3 Volts. Additionally, the switch 324 operates to couple the node 320 to the first supply voltage (VCC) when the laser diode driver 300 is disabled. The laser diode driver 300 is disabled when an externally supplied enable signal (ENABLE) is "low" (i.e., deasserted). The externally supplied enable signal (ENABLE) is received by the laser diode driver 300 and supplied to the bias current source (IBIAS) 304 and the modulation current source (IMOD) 310. An inverter 326 inverts the enable signal (ENABLE) and supplies the inverted enable signal to the switch 324. Hence, when the enable signal (ENABLE) is "low", the inverted enable signal supplied to the switch 324 is "high."

The switch 324 is activated to couple the inverting input of the amplifier 318 (node 320) to the first supply voltage (VCC) when the inverted enable signal is "high." By switching the inverting input of the amplifier 118 to the first supply voltage (VCC), the capacitor 322 discharges such that when the enable signal does subsequently go "high," it will charge smoothly which in turn causes the bias control signal 312 to initially be low following the enabling of the laser diode driver 300. As a result, the laser 302 will not be biased to produce unsafe power levels during the time immediately following the enabling of the laser diode driver 300 (see curve 204, FIG. 2).

According to the first embodiment of the invention, a switching device is provided to pull the inverting input of the amplifier 318 to a "high" level thus discharging the capacitor 322 when the laser diode driver 300 is disabled. Thereafter, when an enable signal (ENABLE) goes "high," the output of the amplifier 318 is "low" and the laser bias current source (IBIAS) 304 remains off until the inverting input of amplifier 318 (node 320) slews down to the reference voltage (REF). The laser bias current provided by the bias current source (IBIAS) 304 thus increases smoothly at a rate set by the capacitor 322. The optical power of the laser 302 also increases smoothly to the desired value as set by the detector current source (IDET).

Figure 4:
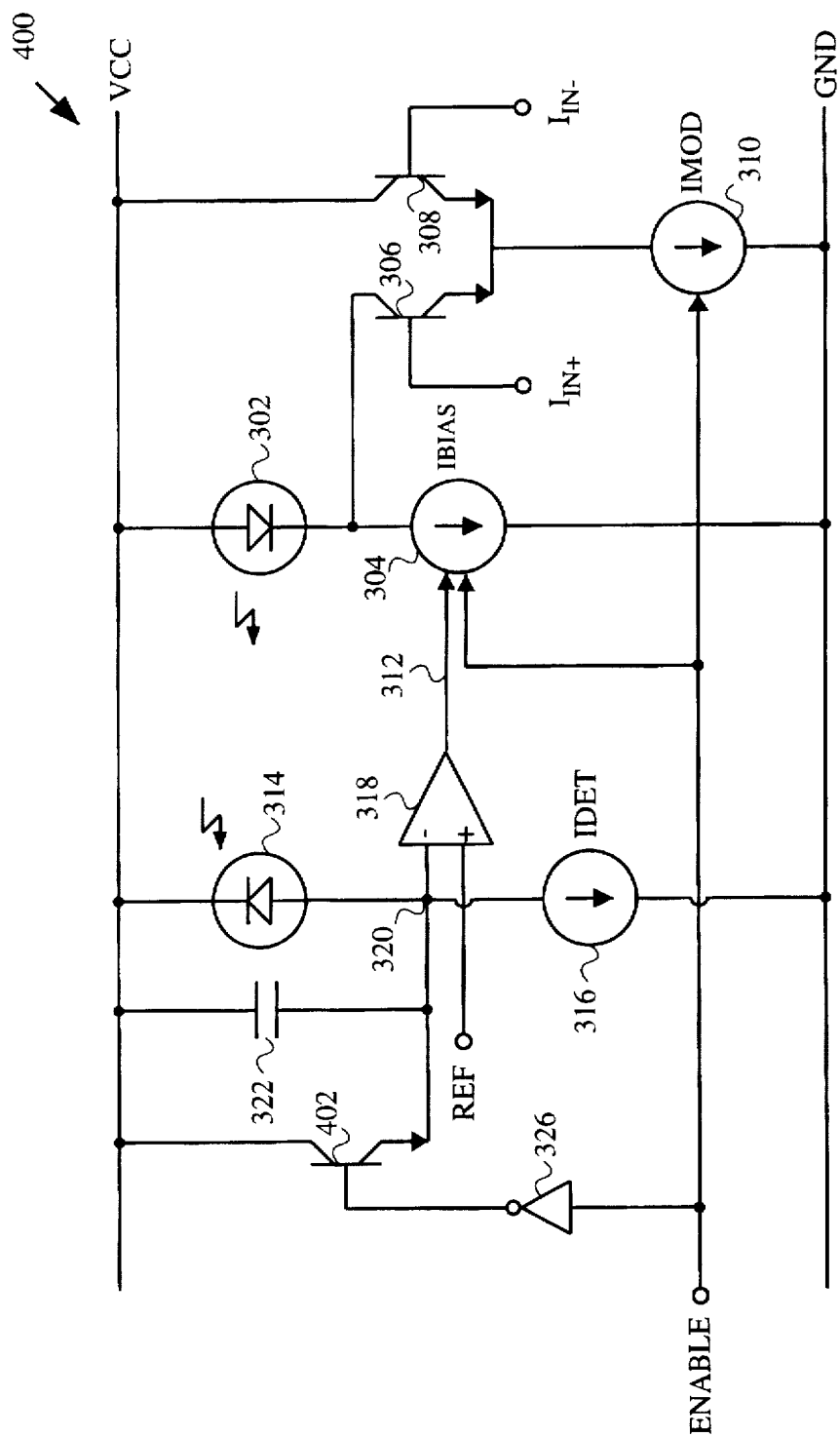
FIG. 4 is an exemplary implementation of a laser diode driver according to the first embodiment of the invention.

FIG. 4 is an exemplary implementation of a laser diode driver 400 according to the first embodiment of the invention. The laser diode driver 400 is constructed in the same manner as the laser diode driver 300, except that the switching device 324 is implemented by a bipolar transistor 402. The bipolar transistor 402 has a base connected to the output of the inverter 326, a collector connected to the first supply voltage (VCC), and an emitter connected to the node 320 as well the inverting input of the amplifier 318. In this case, the node 320 is held at one junction drop below the first supply voltage (VCC) when disabled, but still above the reference voltage (REF). When laser diode driver 400 is enabled, the operation is the same as discussed above for the laser diode driver 300.

Although the first embodiment of the invention switches the inverting input of the amplifier 318 to the first supply voltage, the invention can also be implemented by switching the non-inverting input of the amplifier 318 to the second supply voltage (GND) when the laser diode driver is disabled. In either case, the laser diode driver operates smoothly and safely once enabled. The second, fourth and fifth embodiments of the invention utilize switching on the non-inverting input of the amplifier 318.

Figure 5:
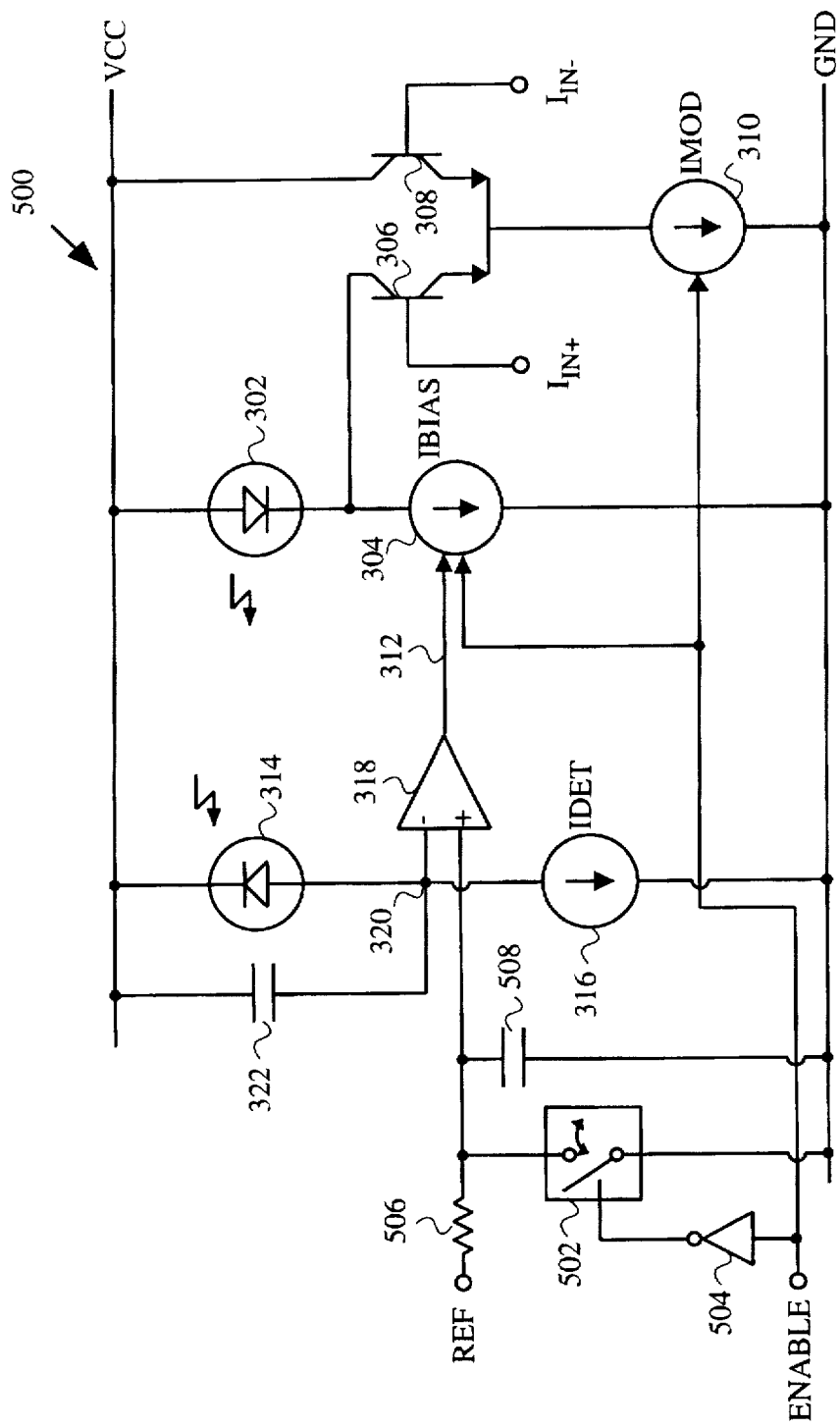
FIG. 5 is a schematic diagram of a laser diode driver according to a second embodiment of the invention.

FIG. 5 is a schematic diagram of a laser diode driver 500 according to a second embodiment of the invention. The laser diode driver 500 has a similar construction to that of the laser diode driver 300, although the switching device 324 and the inverter 326 are no longer provided. Instead, in this embodiment, the non-inverting input of the amplifier 318 is pulled to the second supply voltage (GND), or in other words pulled "low," when the laser diode driver 500 is disabled. This operation is carried out by a switching device 502 coupled between the non-inverting input of the amplifier 318 and the second supply voltage (GND). The switching device 502 is controlled by an inverted enable signal. An inverter 504 receives the enable signal and outputs the inverted output signal to the switching device 502. When the laser diode driver 500 is disabled, the switching device 502 is activated and operates to couple the non-inverting input of the amplifier 318 to the second supply voltage (GND). The laser diode driver 500 further includes a resistor 506 and a capacitor 508 to provide a resistor-capacitor (RC) time constant. Once the laser diode driver 500 is enabled, the switch 502 deactivates (i.e., no longer couples the non-inverting input of the amplifier 318 to the second supply voltage (GND)) and the voltage at the non-inverting input of the amplifier 318 thereafter slowly rises up to the reference voltage (REF). Consequently, when an enable signal (ENABLE) goes "high," the output of the amplifier 318 is "low" and the laser bias current source (IBIAS) 304 remains off until the non-inverting input of the amplifier 318 reaches the reference voltage (REF), at which point the loop for automated power control closes.

Figure 6:
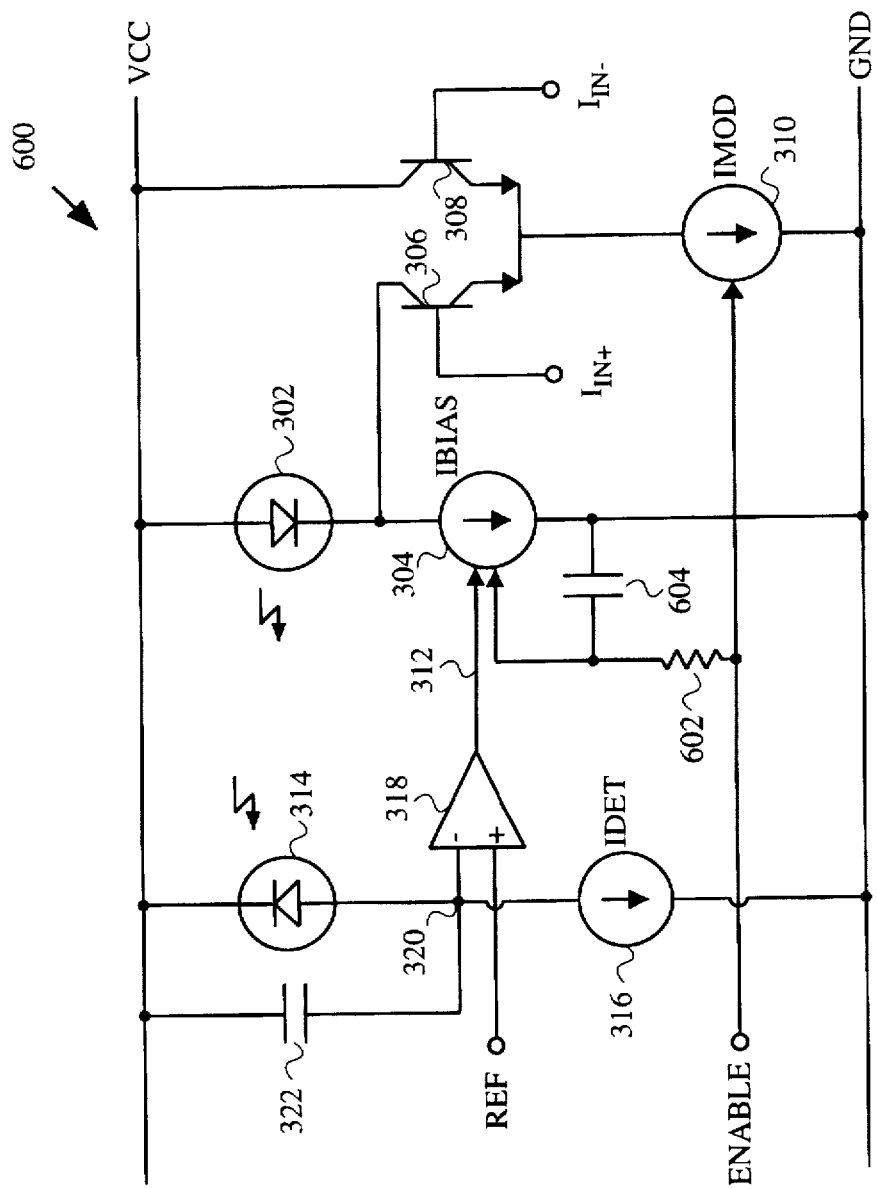
FIG. 6 a schematic diagram of a laser diode driver according to a third embodiment of the invention.

FIG. 6 a schematic diagram of a laser diode driver 600 according to a third embodiment of the invention. The laser diode driver 600 is constructed similar to the laser diode driver 300 of the first embodiment except that the switching device 324 and the inverter 326 are not provided. The connection of an enable terminal of the bias current source (IBIAS) 304 is however different. The laser diode driver 600 includes a resistor 602 and a capacitor 604. The resistor 602 is coupled between the enable signal (ENABLE) and the enable terminal on the bias current source (IBIAS) 304. The capacitor 604 is coupled between the enable terminal on the bias current source (IBIAS) 304 and the second supply voltage (GND). The effect of the resistor 602 and the capacitor 604 are to provide a delay time for enabling the bias current source (IBIAS) 304 following the assertion of the enable signal (ENABLE) to thereby enable the laser diode driver 600. As a result, the laser 302 is not activated until the delay time following the assertion of the enable signal (ENABLE) has passed. This delay allows the bias control signal 312 to settle to its stable value prior to enabling the biased current source (IBIAS) 304. Consequently, the laser diode driver 600 protects the laser 302 from large, unsafe laser bias currents following assertion of the enable signal.

Figure 7:
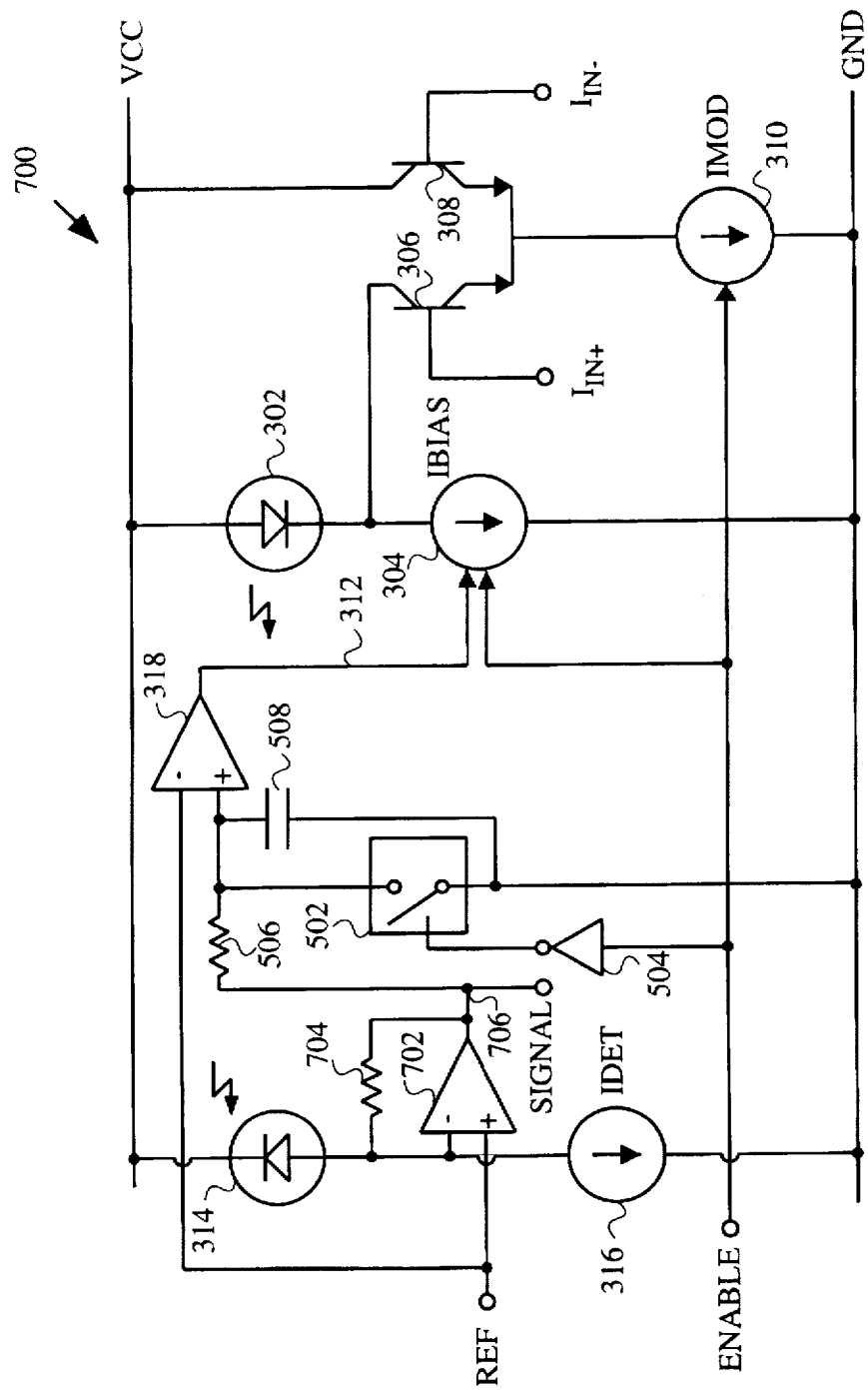
FIG. 7 is a schematic diagram of a laser diode driver according to a fourth embodiment of the invention.

FIG. 7 is a schematic diagram of a laser diode driver 700 according to a fourth embodiment of the invention. The laser diode driver device 700 is constructed in a similar manner to the laser diode driver device 500 according to the second embodiment. The primary differences being that an additional amplifier 702 and resistor 704 are provided as a transimpedance amplifier, and that the capacitor 322 is not provided. Also, the reference voltage (REF) is now supplied to the inverting input of the amplifier 318, and the non-inverting input of the amplifier 318 is coupled to the output of the transimpedance amplifier 702, 704 through the resister 506. The output 706 of the transimpedence amplifier 702,704 produces a high-speed voltage signal that can be used elsewhere in the laser diode driver 700 for other associated circuitry.

Figure 8:
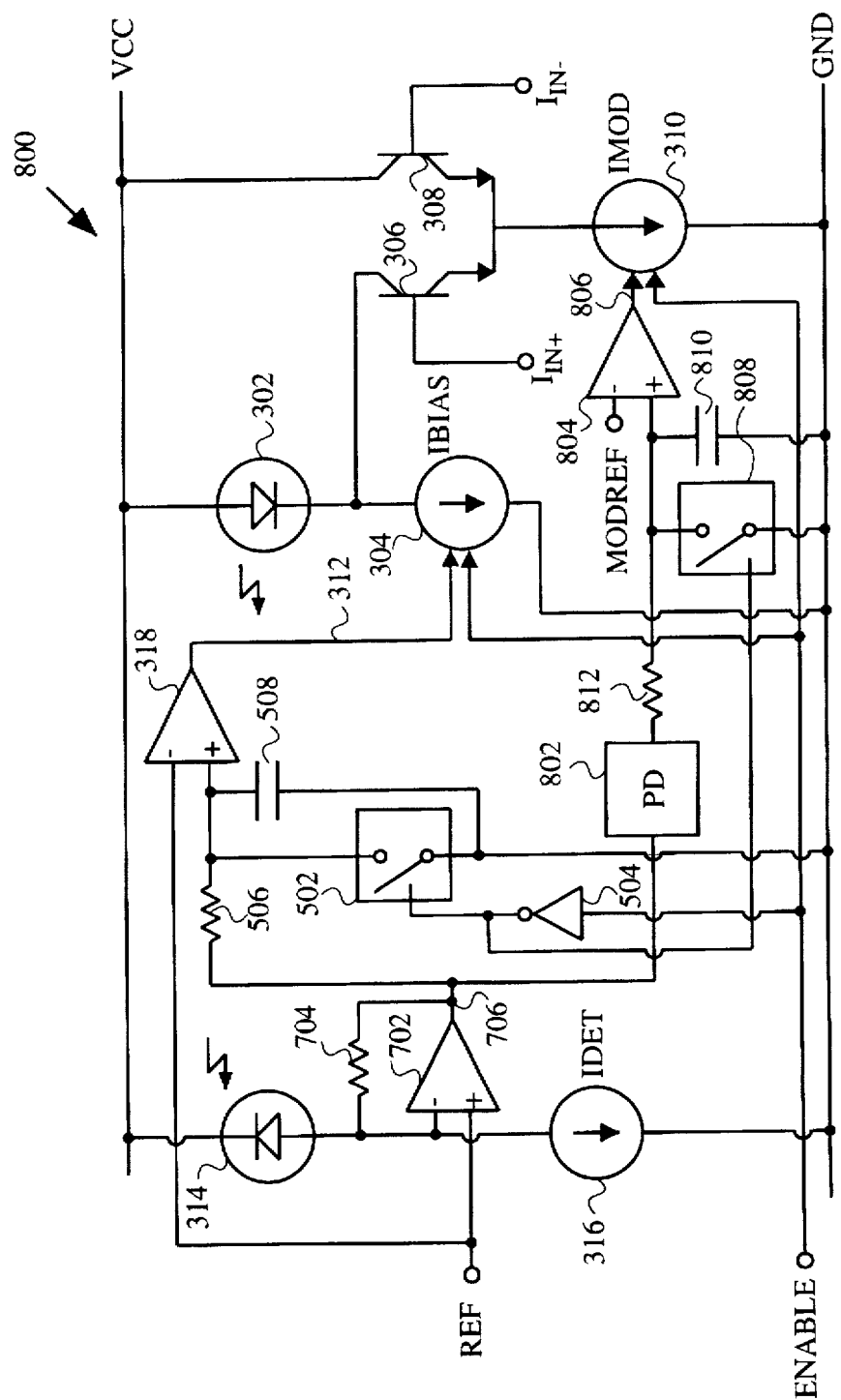
FIG. 8 is a schematic diagram of a laser diode driver according to a fifth embodiment of the invention.

FIG. 8 is a schematic diagram of a laser diode driver 800 according to a fifth embodiment of the invention. The laser diode driver 800 is similar to the laser diode driver 700 illustrated in FIG. 7. The primary difference being the addition of additional electronic devices so as to provide feedback control to the modulation current source (IMOD) 310. This type of feedback is useful to ensure that the difference between a data transmission of a "zero" in contrast to a "one" are uniformly different despite temperature variation or device characteristic changes. The additional circuitry includes a peak detector 802 that identifies the voltage level corresponding to a "one" data transmission, and an amplifier 804 for comparing the peak voltage against a modulation reference voltage (MODREF) (e.g., three Volts) to produce a modulation control signal 806. The modulation control signal 806 is supplied to the modulation current source (IMOD) 310 to adjust the modulation current used to modulate the laser 302 for use in data transmission. The non-inverting input to the amplifier 804 also includes the smooth enablement circuitry to ensure smooth enablement of the modulation current source (IMOD) 310. The smooth enablement circuitry includes a switching device 808, a capacitor 810, and a resistor 812. The switching device 808 is coupled between the non-inverting input to the amplifier 804 and the second supply voltage (GND). The switching device 808 is controlled by the output of the inverter 504 in the same manner as the switching device 502 is controlled. The capacitor 810 is coupled between the non-inverting input of the amplifier 804 and the second supply voltage (GND), and the resistor 812 is serially connected between the non-inverting input of the amplifier 804 and the output of the peak detector 802. The capacitor 810 and the resistor 812 operate to provide a delay time (RC time constant) from which the non-inverting input can slowly rise from a "low" potential value towards the modulation reference voltage value (MODREF) once the enable signal (ENABLE) is asserted to enable the laser diode driver 800. To avoid stability problems due to both feedback loops affecting each other, it is preferable to choose the resister 812 and the capacitor 810 to have a RC time constant different than that of a RC time constant provided by the resister 505 and the capacitor 508.

Switching devices used with the invention can take a number of forms, including a MOSFET, relay, diode switch or an analog switch. In effect, the invention operates to trick a control feedback loop (of automatic power control circuitry) into thinking that there is an excessive detection current when the power supply is energized or when the enable signal is asserted. This is accomplished by switching the inverting input of the amplifier of the automatic power control circuitry to the supply voltage (VCC) or by switching the non-inverting input of the amplifier to ground (GND). Because switching the inverting input at the amplifier to the supply voltage (VCC) discharges the capacitor of the automatic power control circuitry when the laser diode driver is not enabled, once the laser diode driver is enabled, the voltage appearing at the inverting input of the amplifier slowly charges at a controlled rate. In the other case, switching the non-inverting input to the amplifier to ground (GND) holds the voltage appearing at the non-inverting input to the amplifier "low" when the laser diode driver is not enabled. Once the laser diode driver is enabled, the voltage appearing at the non-inverting input of the amplifier slowly charges from ground to the reference voltage (REF) at a controlled rate.

The photodiode 314 is preferably a PIN (p-type intrinsic n-type) monitor photodiode. Alternatively, the photodiode 314 can be an avalanche photodiode, a phototransistor or any other light sensing device.

The laser diode driver according to the invention is particularly suited for an integrated circuit design. The laser diode driver according to the invention is also particularly suited for high-speed data transmission over a communications medium. The communications medium can be either a direct link or networked links. Preferably, the communications medium includes light or optical links such as provided by fiber optics cables.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A laser diode driver for driving a laser, comprising:
   a light sensing device coupled between a voltage supply and a node, said light sensing device senses optical power of the laser;
   a current source coupled to said light sensing device at the node;
   an amplifier having an inverting input and a non-inverting input and producing a bias control signal, the inverting input being coupled to the node and the non-inverting input being coupled to receive a reference voltage, and the bias control signal being used to control the driving of the laser;
   a capacitor coupled between the voltage supply and the node; and
   holding means for holding the bias control signal below a predetermined level during a start-up period.

2. A laser diode driver as recited in claim 1, wherein said amplifier produces the bias control signal based on the difference between the signals received at the inverting input and the non-inverting input.

3. A laser diode driver as recited in claim 1, wherein said holding means holds the bias control signal at a low state during the start-up period.

4. A laser diode driver as recited in claim 1, wherein said laser diode driver is fabricated as an integrated circuit.

5. A laser diode driver as recited in claim 1, wherein said light sensing device is a photodiode optically coupled with the laser, and the bias control signal is used to control an average optical power of the laser.

6. A laser diode driver for driving a laser, said laser diode driver receiving an enable signal and being coupled to a voltage supply, said laser diode driver comprising:
   a light sensing device coupled between the voltage supply and a node, said light sensing device senses optical power of the laser;
   a current source coupled to said light sensing device at the node;
   an amplifier having an inverting input and a non-inverting input and producing a bias control signal, the inverting input being coupled to the node and the non-inverting input being coupled to receive a reference voltage, and the bias control signal being used to control the driving of the laser;

a capacitor coupled between the voltage supply and the node; and a switching device coupled between the voltage supply and the node, said switching device being operated by an inverted enable signal for said laser diode driver.

7. A laser diode driver as recited in claim 6, wherein said switching device is a bipolar transistor connected between the voltage supply and the node, and said bipolar transistor is activated by the inverted enable signal.

8. A laser diode driver as recited in claim 6, wherein said laser diode driver further comprises:

a laser biasing current source for biasing the laser in accordance with the bias control signal;

a signal modulation current source for providing a modulation current; and a modulation switch for providing the modulation current to the laser in accordance with digital signals to be optically transmitted via the laser.

9. A laser diode driver as recited in claim 6, wherein said laser diode driver is an integrated circuit.

10. A laser diode driver as recited in claim 6, wherein said light sensing device is a photodiode optically coupled with the laser, and the bias control signal is used to control an average optical power of the laser.

11. A laser diode driver as recited in claim 10, wherein said switching device is a bipolar transistor connected between the voltage supply and the node, and said bipolar transistor is activated by the inverted enable signal, and wherein said laser diode driver is fabricated as an integrated circuit.

12. A laser diode driver for driving a laser, comprising:

a light sensing device coupled between a voltage supply and a node, said light sensing device senses optical power of the laser;

a current source coupled to said light sensing device at the node;

an amplifier having an inverting input and a non-inverting input and producing a bias control signal, the inverting input being coupled to the node and the non-inverting input being coupled to receive a reference voltage, and the bias control signal being used to control the driving of the laser;

a capacitor coupled between the voltage supply and the node; and means for smoothly enabling said laser diode driver when said laser diode driver is enabled.

13. A laser diode driver as recited in claim 12, wherein said laser diode driver is fabricated as an integrated circuit.

14. A laser diode driver as recited in claim 12, wherein said light sensing device is a photodiode optically coupled with the laser, and the bias control signal is used to control an average optical power of the laser.

15. A method for biasing a laser, comprising:

providing a light sensing device optically coupled to the laser to sense optical power of the laser;

producing a measured voltage indicative of the optical power of the laser using the light sensing device;

comparing the measured voltage against a reference voltage to produce a bias control signal;

modifying a bias drive current for the laser in accordance with the bias control signal;

holding the bias drive current below a first predetermined level during a start-up period;

determining a measured modulation amount from the measured voltage;

comparing the measured modulation amount against a modulation reference voltage to produce a modulation control signal;

modifying a modulation drive current for the laser in accordance with the modulation control signal; and holding the modulation drive current below a second predetermined level during the start-up period.

16. A method as recited in claim 15, wherein the start-up period corresponds to an enable start-up sequence.

17. A method as recited in claim 15, wherein the first predetermined level is substantially off.

18. A method as recited in claim 15, wherein the second predetermined level is substantially off.

19. A method for biasing a laser, comprising:

providing a light sensing device optically coupled to the laser to sense optical power of the laser;

producing a measured voltage indicative of the optical power of the laser using the light sensing device;

comparing the measured voltage against a reference voltage to produce a bias control signal;

modifying a bias drive current for the laser in accordance with the bias control signal;

determining a measured modulation amount from the measured voltage;

comparing the measured modulation amount against a modulation reference voltage to produce a modulation control signal; and modifying a modulation drive current for the laser in accordance with the modulation control signal.

20. A method as recited in claim 21 further comprising holding the modulation drive current below a predetermined level during a start-up period.

21. A method as recited in claim 20, wherein the start-up period corresponds to an enable start-up sequence.

* * * * *